United States Patent
Krupnik

(10) Patent No.: US 6,525,608 B2
(45) Date of Patent: Feb. 25, 2003

(54) HIGH GAIN, HIGH BANDWIDTH, FULLY DIFFERENTIAL AMPLIFIER

(75) Inventor: Yoel Krupnik, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/819,299

(22) Filed: Mar. 27, 2001

(65) Prior Publication Data

US 2002/0171486 A1 Nov. 21, 2002

(51) Int. Cl.[7] .................................................. H03F 3/45
(52) U.S. Cl. ......................... 330/253; 330/257; 330/260
(58) Field of Search ................................. 330/253, 257, 330/260

(56) References Cited

U.S. PATENT DOCUMENTS

| 4,958,133 A | * | 9/1990 | Bazes .......................... 330/253 |
| 5,442,318 A | * | 8/1995 | Badyal et al. ............... 330/253 |
| 5,703,532 A | * | 12/1997 | Shin et al. .................. 330/253 |
| 5,748,040 A | * | 5/1998 | Leung ......................... 330/253 |
| 6,278,323 B1 | * | 8/2001 | Bazes ......................... 330/257 |
| 2002/0050859 A1 | | 5/2002 | Bazes |

* cited by examiner

Primary Examiner—Robert Pascal
Assistant Examiner—Khanh Van Nguyen
(74) Attorney, Agent, or Firm—Seth Z. Kalson

(57) ABSTRACT

A differential-input, differential-output CMOS amplifier having a first differential pair with a first transistor folded with a first cascode transistor, and a second differential pair with a first transistor folded with a second cascode transistor, and having a first auxiliary amplifier to provide negative feedback to the first and second cascode transistors to boost amplifier gain, where the first and second cascode transistors have gates at the same potential. The first differential pair has a second transistor folded with a third cascode transistor, and the second differential pair has a second transistor folded with a fourth cascode transistor, where a second auxiliary amplifier provides negative feedback to the third and fourth cascode transistors to boost amplifier gain, where the third and fourth cascode transistors have gates at the same potential.

14 Claims, 1 Drawing Sheet

HIGH GAIN, HIGH BANDWIDTH, FULLY DIFFERENTIAL AMPLIFIER

FIELD

Embodiments of the present invention relate to analog circuits, and more particularly, to differential amplifiers.

BACKGROUND

A fully differential amplifier provides an output differential signal in response to an input differential signal. A differential signal comprises two signals, where the difference in the two signals contains the relevant information. For example, the input and output differential signals may be voltage signals centered about $V_{cc}/2$, within the range $[V_{ss}, V_{cc}]$ where $V_{ss}$ is a substrate voltage and $V_{cc}$ is a power rail (or core) voltage.

Fully differential amplifiers find many applications, such as in sensitive, high-speed analog-to-digital converters employing switched capacitor circuits. Furthermore, it is desirable for differential amplifiers to have large gain-bandwidth products, where CMOS (Complementary-Metal-Oxide-Semiconductor) process technology may be employed.

DESCRIPTION OF EMBODIMENTS

Figure 1:
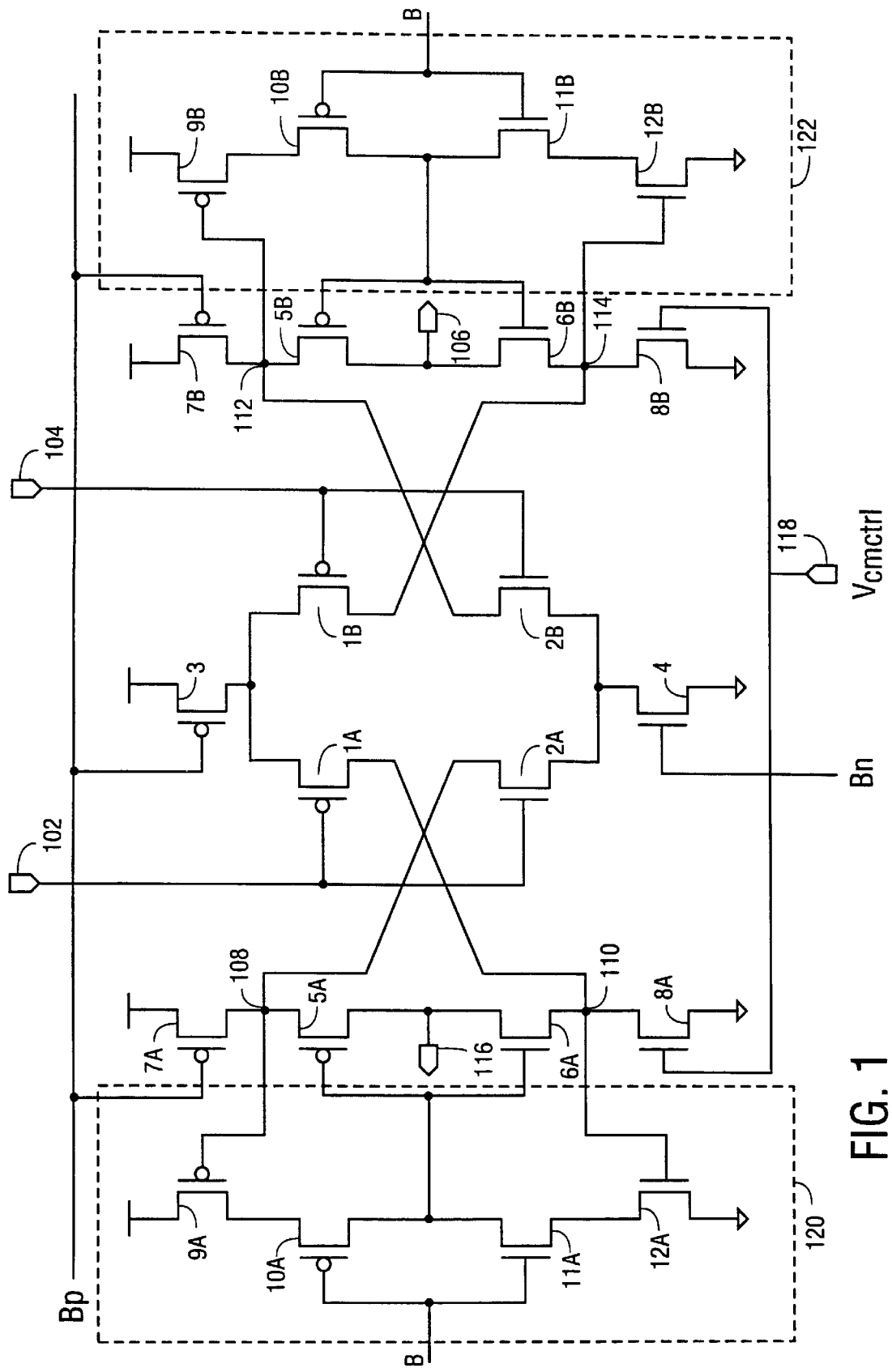
FIG. 1 is a circuit for an embodiment of the present invention.

FIG. 1 is a circuit for a fully differential amplifier, where nodes (ports) 102 and 104 are input nodes (ports) and nodes (ports) 106 and 116 are output nodes (ports). The differential amplifier of FIG. 1 may be considered a transconductance amplifier, in that a small-signal current is provided to one or more loads in response to a differential voltage at input nodes 102 and 104, where one load may be taken as the output resistance of transistor 5B in parallel with transistor 6B and another load may be taken as the output resistance of transistor 5A in parallel with transistor 6A.

Transistors 1A and 1B are pMOSFETs (p-Metal-Oxide-Semiconductor-Field-Effect-Transistor) arranged as a first differential pair of transistors having their sources connected to each other, and transistors 2A and 2B are nMOSFETs arranged as a second differential pair having their sources connected to each other. The two differential pairs are complementary to each other in that they comprise transistors having complementary carrier types, i.e., transistors 1A and 1B are of p-carrier type and transistors 2A and 2B are of n-carrier type. The gates of transistors 1A and 2A are connected to input node 102, and the gates of transistors 1B and 2B are connected to input node 104.

The complementary arrangement of the amplifier of FIG. 1 provides for a very wide common mode range of operation, as reasoned as follows. If the common mode input voltage is low such that transistors 2A and 2B are in cut-off, then transistors 1A and 1B will still be ON and will continue to amplify. Conversely, if the common mode input voltage is high such that transistors 1A and 1B are in cut-off, then transistors 2A and 2B will still be ON and will continue to amplify. In this way, the amplifier of FIG. 1 will provide amplification over a wide common mode input voltage range.

Transistor 3 sources bias current to the differential pair 1A and 1B. Transistors 8A and 8B comprise a current mirror. Transistor 8A sinks bias currents from transistors 1A and 6A, and transistor 8B sinks bias currents from transistors 1B and 6B. The bias current sourced by transistor 3 is equal in magnitude to the sum of the bias currents sunk by transistors 1A and 1B. When the voltage differential between nodes 102 and 104 is zero, transistors 8A and 8B sink equal bias currents.

Similarly, transistors 7A and 7B comprise a current mirror. Transistor 7A sources bias currents to transistors 2A and 5A, and transistor 7B sources bias currents to transistors 2B and 5B. Transistor 4 sinks bias current from the differential pair 2A and 2B. The bias current sunk by transistor 4 is equal in magnitude to the sum of the bias currents sourced by transistors 2A and 2B. When the voltage differential between nodes 102 and 104 is zero, transistors 7A and 7B source equal bias currents.

The gates of transistors 7A, 7B, and 3 are biased by a voltage $B_p$. The gate of transistor 4 is biased at a voltage $B_n$. The gates of transistors 8A and 8B are biased by a voltage $V_{cmctrl}$ applied to port 118. In one embodiment, common mode feedback is employed to provide the voltage $V_{cmctrl}$, where for example, $$V_{cmctrl} = A[(V_{106} + V_{116})/2 - V_{cref}],$$

where A is a feedback constant, $V_{106}$ and $V_{116}$ are output voltages at output ports 106 and 116, respectively, and $V_{cref}$ is a common-mode reference voltage.

Transistors 2B and 5B are arranged as a folded-cascode pair. Transistor 5B is a pMOSFET, so that the folded-cascode pair 2B and 5B is comprised of transistors having complementary carrier types. Cascode transistor 5B provides impedance translation. That is, the impedance at node 112 is very much smaller than the impedance at node 106. Similarly, transistors 1B and 6B are arranged as a folded-cascode pair with complementary carrier types, where the impedance at node 114 is much smaller than the impedance at node 106. The gates of transistors 5B and 6B are connected to each other so as to be biased at the same voltage.

Transistors 5A and 2A, and transistors 6A and 1A, are also arranged as folded-cascode pairs having complementary carrier types, and impedance translation is provided so that the impedances at nodes 108 and 110 are much smaller than the impedance at node 116. The gates of transistors 5A and 6A are connected to each other so as to be biased at the same voltage. The use of folded-cascode pairs provide high output impedance, which helps to provide a high amplifier gain because gain is determined by the product of the input transconductance and the output impedance.

Auxiliary amplifiers 120 and 122 provide negative feedback to reduce voltage variations at nodes 112, 114, 108 and 110. For the embodiment of FIG. 1, auxiliary amplifier 120 comprises transistors 9A, 10A, 11A, and 12A, and auxiliary amplifier 122 comprises transistors 9B, 10B, 11B, and 12B. The gates of transistors 10A and 11A, and the gates of transistors 10B and 10A, are biased to a voltage B. Transistors 9A and 10A; transistors 11A and 12A; transistors 9B and 10B; and transistors 11B and 12B are cascode pairs. For example, the cascode pair 9B and 10B amplifies the voltage variation at node 112 and applies this amplified voltage variation in negative feedback fashion to the gate of transistor 5B.

By providing negative feedback, auxiliary amplifiers 120 and 122 increase the output impedance of the amplifier so as to increase the overall gain of the amplifier. This is sometimes referred to as gain boosting, which may be described as follows. Denote the small-signal gain of the amplifier of FIG. 1 by $a_B$. Let the small-signal gain of amplifiers 120 and 122 be denoted by $a_v$. If now auxiliary amplifiers 120 and 122 are removed, and the gates of transistors 5A, 5B, 5B, and 6B are biased to the voltage B, then denote the resulting small-signal gain by let a. Then, gain boosting yields, approximately, $$a_B = a_v a. \tag{1}$$

That is, auxiliary amplifiers 120 and 122 boost the gain of an amplifier without auxiliary amplifiers 120 and 122 by a multiplicative factor equal to the gain of the auxiliary amplifiers. Equation (1) may be derived as follows.

First, consider the circuit of FIG. 1 in which auxiliary amplifiers 120 and 122 are not present. The gain a is given by $$a = g_m r_{out}, \tag{2}$$

where $g_m$ is the amplifier transconductance and $r_{out}$ is the amplifier small-signal output resistance. The amplifier output resistance is equal to the combination of the small-signal output resistance at node 106 when transistor 6B is open-circuited in parallel with the small-signal output resistance at node 106 when transistor 5B is open-circuited. Denoting the former and latter output resistances, respectively, as $r_{out5}$ and $r_{out6}$, the amplifier output resistance may be expressed as $$r_{out} = r_{out5} \| r_{out6}. \tag{3}$$

An approximate expression for the output resistance $r_{out5}$ may be derived as follows. Let $v_{out}$ denote the small-signal output voltage at output node 106, and let $i_{out}$ denote the small-signal current at node 106 in the direction looking into the amplifier. Let $v_{s5}$ denote the small-signal voltage at the source (node 112) of transistor 5B, let $r_{ds5}$ denote the drain-source resistance of transistor 5B, and let $g_{m5}$ denote the transconductance of transistor 5B. Remembering now that amplifiers 120 and 122 have been removed and the gate of transistor 5B is biased at a constant voltage, the small-signal gate-to-source voltage of transistor 5B is equal to the negative of $v_{s5}$. The low-frequency small-signal equivalent circuit for transistor 5B with $-v_{s5}$ substituted for the small-signal gate-to-source voltage of transistor 5B yields.

$$i_{out} = -g_{m5} v_{s5} + \frac{v_{out} - v_{s5}}{r_{ds5}}. \tag{4}$$

Let $r_{ds2}$ denote the drain-source resistance of transistor 2B. Because transistor 7B may be approximated as a constant current source, the small-signal current through transistor 2B is equal to $i_{out}$. With this approximation, and the approximation that the source voltage of transistor 2B is zero, and noting that the voltage at node 104 is held constant to compute the output resistance, the low-frequency small-signal equivalent circuit for transistor 2B yields $$i_{out} = \frac{v_{s5}}{r_{ds2}}. \tag{5}$$

Simultaneously solving equations (4) and (5) for $v_{out}$ yields $$v_{out} = \frac{v_{s5}}{r_{ds2}}(r_{ds5} + r_{ds2} + g_{m5} r_{ds5} r_{ds2}). \tag{6}$$

The output resistance $r_{out5}$ is $$r_{out5} = v_{out}/i_{out}. \tag{7}$$

Substituting into equation (7) the expression for $i_{out}$ given by equation (5) and the expression for $v_{out}$ given by equation (6) yields $$r_{out5} = r_{ds5} + r_{ds2} + g_{m5} r_{ds5} r_{ds2} \approx g_{m5} r_{ds5} r_{ds2}. \tag{8}$$

The above equation expresses the well-known advantage of a folded-cascode pair in providing high output impedance.

A similar analysis for $r_{out6}$ gives $$r_{out6} \approx g_{m6} r_{ds6} r_{ds1}, \tag{9}$$

where $g_{m6}$ and $r_{ds6}$ are the transconductance and drain-source resistance, respectively, of transistor 6B, and $r_{ds1}$ is the drain-source resistance of transistor 1B.

Now consider the circuit of FIG. 1 with auxiliary amplifiers 120 and 122 present. Amplifiers with or without auxiliary amplifiers 120 and 122 will have essentially the same transconductance, so that equation (2) now becomes $$a_B = g_m r_{out}, \tag{10}$$

where $r_{out}$ in equation (10) is now the output resistance of the circuit of FIG. 1 with auxiliary amplifiers 120 and 122 present. Again, equation (3) will hold in which now $r_{out5}$ and $r_{out6}$ are, respectively, the output resistances of the circuit of FIG. 1 with auxiliary amplifiers 120 and 122 when transistors 6B and 5B are open-circuited.

Consequently, amplifier gain scales according to $r_{out5}$ and $r_{out6}$, and equation (1) follows by showing that $r_{out5}$ and $r_{out6}$ for the circuit of FIG. 1 with auxiliary amplifiers 120 and 122 are each $a_v$ times $r_{out5}$ and $r_{out6}$, respectively, for the circuit of FIG. 1 without auxiliary amplifiers 120 and 122. This easily follows by noting that the gate-to-source voltage $v_{gs5}$ of transistor 5B is now given by $$v_{gs5} = -a_v v_{s5} - v_{s5} = -v_{s5}(1 + a_v). \tag{11}$$

Applying equation (11) to the low-frequency small-signal circuit for transistor 5B yields $$i_{out} = -g_{m5} v_{s5}(1 + a_v) + \frac{v_{out} - v_{s5}}{r_{ds5}}. \tag{12}$$

Equation (12) is identical to equation (4) if $g_{m5}$ in equation (4) is replaced with $g_{m5}(1+a_v)$. Consequently, $r_{out5}$ and $r_{out6}$ are now given, respectively, by $$r_{out5} \approx g_{m5}(1+a_v) r_{ds5} r_{ds2} \approx g_{m5} a_v r_{ds5} r_{ds2}, \tag{13}$$

and $$r_{out6} \approx g_{m6} a_v r_{ds6} r_{ds1}, \tag{14}$$

and equation (1) therefore follows.

Various modifications may be made to the described embodiments without departing from the scope of the invention as claimed below.

I claim:

1. An amplifier comprising:
   a first differential pair comprising first and second transistors;
   a first cascode transistor coupled to the first transistor of the first differential pair to form a folded-cascode pair, the first cascode transistor having a first terminal and a second terminal;

a first current mirror comprising first and second transistors to bias currents in the first and second transistors of the first differential pair, wherein the first transistor of the first current mirror is coupled to bias current in the first cascode transistor;

a second differential pair comprising first and second transistors;

a second cascode transistor coupled to the first transistor of the second differential pair to form a folded-cascode pair, the second cascode transistor having a first terminal and a second terminal;

a second current mirror comprising first and second transistors to bias currents in the first and second transistors of the second differential pair, wherein the first transistor of the second current mirror is coupled to bias current in the second cascode transistor; and a first auxiliary amplifier to provide negative feedback from the first terminal of the first cascode transistor to the second terminal of the first cascode transistor and to provide negative feedback from the first terminal of the second cascode transistor to the second terminal of the second cascode transistor, wherein the second terminals of the first and second cascode transistors are at a same potential.

2. The amplifier as set forth in claim 1, wherein the first and second transistors of the first differential pair are field effect transistors having a first carrier type;

the first and second transistors of the first current mirror are field effect transistors having a second carrier type complementary to the first carrier type; and the first cascode transistor is a field effect transistor wherein the first terminal comprises a source and the second terminal comprises a gate.

3. The amplifier as set forth in claim 2, wherein the first auxiliary amplifier comprises:

a first field effect transistor having the second carrier type, having a gate connected to the source of the first cascode transistor, and having a drain; and a second field effect transistor having the second carrier type, having a source connected to the drain of the first field effect transistor of the first auxiliary amplifier, and a drain connected to the gate of the first cascode transistor.

4. The amplifier as set forth in claim 1, further comprising:

a third cascode transistor coupled to the second transistor of the first differential pair to form a folded-cascode pair, the third cascode transistor having a first terminal and a second terminal;

a fourth cascode transistor coupled to the second transistor of the second differential pair to form a folded-cascode pair, the fourth cascode transistor having a first terminal and a second terminal; and a second auxiliary amplifier to provide negative feedback from the first terminal of the third cascode transistor to the second terminal of the third cascode transistor, and to provide negative feedback from the first terminal of the fourth cascode transistor to the second terminal of the fourth cascode transistor.

5. The amplifier as set forth in claim 4, wherein the second terminals of the third and fourth cascode transistors are at a same potential.

6. The amplifier as set forth in claim 4, wherein the first and second transistors of the first differential pair, the first and second transistors of the second current mirror, and the second and fourth cascode transistors are each field effect transistors having a first carrier type, a source, a gate, and a drain; and the first and second transistors of the second differential pair, the first and second transistors of the first current mirror, and the first and third cascode transistors are each field effect transistors having a second carrier type complementary to the first carrier type, a source, a gate, and a drain;

wherein the first terminals of the first, second, third, and fourth cascode transistors each comprise their respective sources; and the second terminals of the first, second, third, and fourth cascode transistors each comprise their respective gates.

7. An amplifier to provide a first output voltage indicative of a differential of first and second input voltages, the operational amplifier comprising:

a first input node at the first input voltage;

a second input node at the second input voltage;

a first output node at the first output voltage;

a first differential pair comprising first and second transistors;

a first cascode transistor coupled to the first transistor of the first differential pair to form a folded-cascode pair;

a second differential pair comprising first and second transistors; wherein the first transistors of the first and second differential pairs are coupled to the first input node to be responsive to the first input voltage, and the second transistors of the first and second differential pair are coupled to the second input node to be responsive to the second input voltage;

a second cascode transistor coupled to the first transistor of the second differential pair to form a folded-cascode pair;

a first current mirror comprising first and second transistors to sink, respectively, current from the first and second transistors of the first differential pair, wherein the first transistor of the first current mirror is coupled to sink current from the first cascode transistor;

a second current mirror comprising first and second transistors to source, respectively, current to the first and second transistors of the second differential pair, wherein the first transistor of the second current mirror is coupled to source current to the second cascode transistor; and a first auxiliary amplifier comprising an output port having a feedback voltage to control current flow in the first cascode transistor by negative feedback, and to control current flow in the second cascode transistor by negative feedback, wherein the first and second cascode transistors are controlled by the feedback voltage;

wherein the first and second cascode transistors are coupled to the first output node to provide the first output voltage.

8. The amplifier as set forth in claim 7, the amplifier further providing a second output voltage indicative of the differential of the first and second input voltages, the amplifier further comprising:

a second output node at the second output voltage;

a third cascode transistor coupled to the second transistor of the first differential pair to form a folded-cascode pair;

a fourth cascode transistor coupled to the second transistor of the second differential pair to form a folded-cascode pair; and a second auxiliary amplifier to control current flow in the third cascode transistor by negative feedback, and to control current flow in the fourth cascode transistor by negative feedback;

wherein the third and fourth cascode transistors are coupled to the second output node to provide the second output voltage.

9. The operational amplifier as set forth in claim 8, wherein the first and second transistors of the first differential pair, the second and fourth cascode transistors, and the first and second transistors of the second current mirror are pFETs; and the first and second transistors of the second differential pair, the first and third cascode transistors and the first and second transistors of the first current mirror are nFETs;

wherein the first and second cascode transistors have gates having a same potential, and the third and fourth cascode transistors have gates having a same potential.

10. An amplifier comprising:

a first differential pair comprising first and second unipolar transistors of a first carrier type, each having a drain, a gate, and a source;

a first cascode unipolar transistor of a second carrier type complementary to the first carrier type, having a gate, having a drain, and having a source connected to the drain of first transistor of the first differential pair;

a first current mirror comprising first and second unipolar transistors of the second carrier type, each having a gate, a drain, and a source, wherein the drain of the first transistor of the first current mirror is connected to the drain of the first transistor of the first differential pair, and wherein the drain of the second transistor of the first current mirror is connected to the drain of the second transistor of the first differential pair;

a second differential pair comprising first and second unipolar transistors of the second carrier type, each having a drain, a gate, and a source;

a second cascode unipolar transistor of the first carrier type, having a gate, having a drain, and having a source connected to the drain of first transistor of the second differential pair;

a second current mirror comprising first and second unipolar transistors of the first carrier type, each having a gate, a drain, and a source, wherein the drain of the first transistor of the second current mirror is connected to the drain of the first transistor of the second differential pair, and wherein the drain of the second transistor of the second current mirror is connected to the drain of the second transistor of the second differential pair;

a third cascode unipolar transistor of the second carrier type, having a gate, having a drain, and having a source connected to the drain of second transistor of the first differential pair;

a fourth cascode unipolar transistor of the first carrier type, having a gate, having a drain, and having a source connected to the drain of second transistor of the second differential pair;

a first auxiliary amplifier to provide feedback from the source of the first cascode transistor to the gate of the first cascode transistor, and to provide feedback from the source of the second cascode transistor to the gate of the second cascode transistor; and a second auxiliary amplifier to provide feedback from the source of the third cascode transistor to the gate of the third cascode transistor, and to provide feedback from the source of the fourth cascode transistor to the gate of the fourth cascode transistor;

wherein the gates of the first and second cascode transistors are connected to each other, and the gates of the third and fourth cascode transistors are connected to each other.

11. The amplifier as set forth in claim 10, the first auxiliary amplifier comprising:

a first unipolar transistor of the second carrier type having a gate connected to the source of the first cascode transistor, and having a drain;

a second unipolar transistor of the second carrier type having a source connected to the drain of the first transistor of the first auxiliary amplifier, and having a drain connected to the gate of the first cascode transistor;

a third unipolar transistor of the first carrier type having a gate connected to the source of the second cascode transistor, and having a drain; and a fourth unipolar transistor of the first carrier type having a source connected to the drain of the third transistor of the first auxiliary amplifier, and having a drain connected to the gate of the second cascode transistor and to the drain of the second transistor of the first auxiliary amplifier.

12. An amplifier comprising:

a first differential pair;

a first current mirror to sink current from the first differential pair;

a second differential pair;

a second current mirror to source current to the second differential pair;

a first cascode transistor connected to the first differential pair;

a second cascode transistor connected to the second differential pair;

a third cascode transistor connected to the first differential pair;

a fourth cascode transistor connected to the second differential pair;

a first auxiliary amplifier comprising an output port connected to the first and second cascode transistors to provide feedback to control current in the first and second cascode transistors; and a second auxiliary amplifier comprising an output port connected to the third and fourth cascode transistors to provide feedback to control current in the third and fourth cascode transistors.

13. The amplifier as set forth in claim 12, wherein the first and second cascode transistors are field effect transistors each having a drain, source, and gate, wherein the gates of the first and second cascode transistors are connected to each other and the drains of the first and second cascode transistors are connected to each other;

the third and fourth cascode transistors are field effect transistors each having a drain, source, and gate, wherein the gates of the third and fourth cascode transistors are connected to each other and the drains of the third and fourth cascode transistors are connected to each other;

wherein the first auxiliary amplifier is connected to the first and second cascode transistors to provide negative feedback from the source of the first cascode transistor to the gate of the first cascode transistor and to provide negative feedback from the source of the second cascode transistor to the gate of the second cascode transistor; and wherein the second auxiliary amplifier is connected to the third and fourth cascode transistors to provide negative feedback from the source of the third cascode transistor to the gate of the third cascode transistor and to provide negative feedback from the source of the fourth cascode transistor to the gate of the fourth cascode transistor.

14. The amplifier as set forth in claim 13, wherein the first auxiliary amplifier comprises:

a first field effect transistor having a gate connected to the source of the first cascode transistor, and having a drain;

a second field effect transistor having a source connected to the drain of the first transistor of the first auxiliary amplifier and having a drain connected to the gate of the first cascode transistor;

a third field effect transistor having a gate connected to the source of the second cascode transistor, and having a drain; and a fourth field effect transistor having a source connected to the drain of the third transistor of the first auxiliary amplifier and having a drain connected to the gate of the second cascode transistor and to the drain of the first transistor of the first auxiliary amplifier.

* * * * *